US011555250B2

(12) United States Patent
Guo et al.

(10) Patent No.: US 11,555,250 B2
(45) Date of Patent: Jan. 17, 2023

(54) ORGANIC CONTAMINATION FREE SURFACE MACHINING

(71) Applicant: Applied Materials, Inc., Santa Clara, CA (US)

(72) Inventors: Yuanhong Guo, Mountain View, CA (US); Sheng Michael Guo, San Mateo, CA (US); Marek W Radko, San Jose, CA (US); Steven Victor Sansoni, Livermore, CA (US); Nagendra Madiwal, Cupertino, CA (US); Matvey Farber, Redwood City, CA (US); Pingping Gou, Foster City, CA (US); Song-Moon Suh, San Jose, CA (US); Jeffrey C. Hudgens, San Francisco, CA (US); Yuji Murayama, Los Gatos, CA (US); Anurag Bansal, Fremont, CA (US); Shaofeng Chen, Austin, TX (US); Michael Kuchar, Georgetown, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/241,241

(22) Filed: Apr. 27, 2021

(65) Prior Publication Data
US 2021/0339354 A1    Nov. 4, 2021

Related U.S. Application Data

(60) Provisional application No. 63/017,610, filed on Apr. 29, 2020.

(51) Int. Cl.
*C23F 17/00*    (2006.01)
*B23C 3/00*    (2006.01)
(Continued)

(52) U.S. Cl.
CPC ............... *C23F 17/00* (2013.01); *B08B 3/04* (2013.01); *B23C 3/00* (2013.01); *C23F 1/16* (2013.01); *C23F 1/20* (2013.01); *H01L 21/67184* (2013.01)

(58) Field of Classification Search
None
See application file for complete search history.

(56) References Cited

U.S. PATENT DOCUMENTS

| 6,179,923 B1 * | 1/2001 | Yamamoto | C23C 14/12 |
| | | | 118/726 |
| 2010/0108641 A1 * | 5/2010 | West | H01J 37/32458 |
| | | | 216/94 |

(Continued)

FOREIGN PATENT DOCUMENTS

| CN | 108330476 A * | 7/2018 | ............. C23C 22/34 |
| CN | 207593498 U | 7/2018 | |

(Continued)

OTHER PUBLICATIONS

International Search Report and Written Opinion dated Aug. 12, 2021, for PCT Patent Application No. PCT/US2021/029735.

*Primary Examiner* — Jason Berman
(74) *Attorney, Agent, or Firm* — Lowenstein Sandler LLP

(57) ABSTRACT

A method includes receiving a metal component including a raw surface that includes a metal base, a first native oxide disposed on the metal base, and hydrocarbons disposed on the metal base. The method further includes machining the raw surface of the metal component to remove the first native oxide and a first portion of the hydrocarbons from the metal base. The machining generates an as-machined surface of the metal component including the metal base without the first native oxide and without the first portion of the hydrocarbons. The method further includes performing a surface machining of the as-machined surface of the metal (Continued)

component to remove a second portion of the hydrocarbons. The method further includes surface treating the metal component to remove a third portion of the hydrocarbons. The method further includes performing a cleaning of the metal component and drying the metal component.

20 Claims, 6 Drawing Sheets

(51) Int. Cl.
    *C23F 1/16*         (2006.01)
    *C23F 1/20*         (2006.01)
    *B08B 3/04*         (2006.01)
    *H01L 21/67*       (2006.01)

(56) References Cited

U.S. PATENT DOCUMENTS

2019/0078195 A1*   3/2019   Murata ............... C23C 14/3407
2020/0035525 A1     1/2020   Bao et al.

FOREIGN PATENT DOCUMENTS

| EP | 1600258 A1 | 11/2005 |
| EP | 1605498 A1 | 12/2005 |
| JP | 2005277396 A | 10/2005 |

* cited by examiner

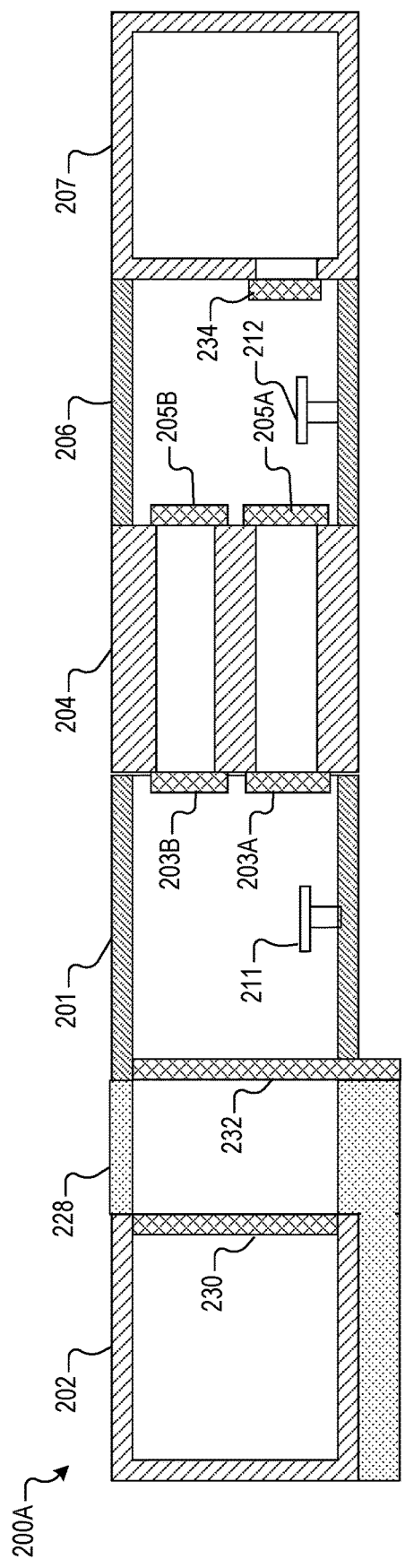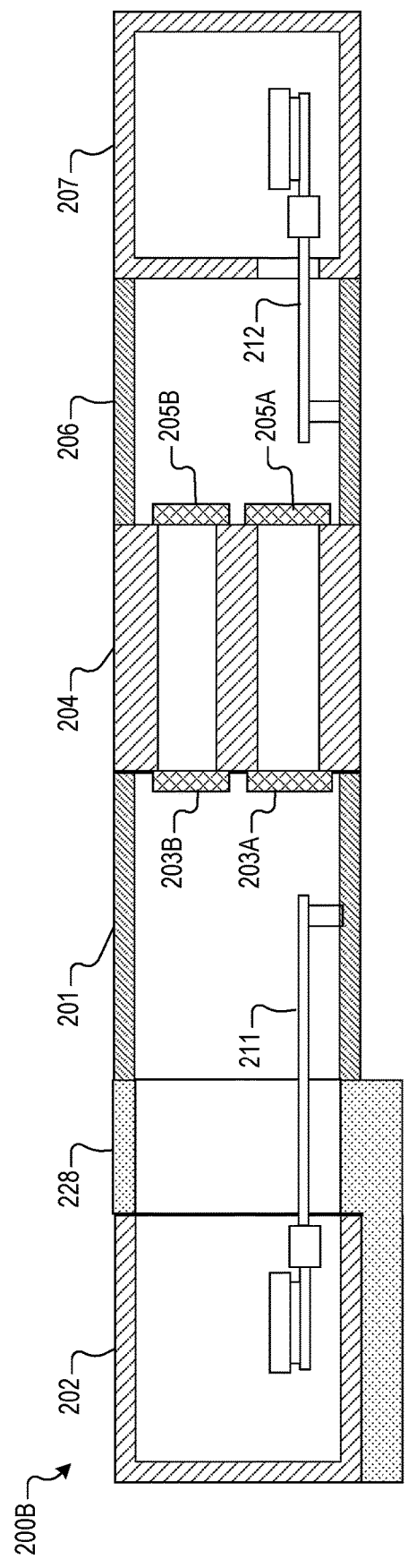
FIG. 2A
FIG. 2B

ORGANIC CONTAMINATION FREE SURFACE MACHINING

RELATED APPLICATION

This application claims benefit of U.S. Provisional Patent Application 63/017,610, filed Apr. 29, 2020, the entire content of which is incorporated by reference herein.

TECHNICAL FIELD

Embodiments of the present disclosure relate to surface machining in manufacturing systems, such as substrate processing systems, and in particular to organic contamination free surface machining in a manufacturing system.

BACKGROUND

In semiconductor processing and other electronics processing, objects, such as substrates, are transported between portions of the system. The different portions of the system include storage areas, transfer areas, processing areas, and so forth. Such storage areas, transfer areas, processing areas, and so on are generally composed of metals that have contaminants therein. Such contaminants are known to migrate onto substrates stored in, processed by and/or passed through the storage areas, transfer areas, processing areas, and so on.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes receiving a metal component including a raw surface that includes a metal base, a first native oxide disposed on the metal base, and hydrocarbons disposed on the metal base. The method further includes machining the raw surface of the metal component to remove the first native oxide and a first portion of the hydrocarbons from the metal base. The machining generates an as-machined surface of the metal component including the metal base without the first native oxide and without the first portion of the hydrocarbons. Subsequent to the machining, the method further includes performing surface machining of the as-machined surface of the metal component to remove a second portion of the hydrocarbons to generate a finished surface of the metal component. Subsequent to the surface machining, the method includes surface treating the metal component to remove a third portion of the hydrocarbons. Subsequent to the surface treating, the method further includes performing a cleaning of the metal component. Subsequent to the performing of the cleaning, the method further includes drying the metal component to generate the finished surface of the metal component In another aspect of the disclosure, a method includes generating a finished surface of a metal vacuum chamber component of a substrate processing system. The generating includes machining a raw surface of the metal vacuum chamber component to remove a first native oxide and a first portion of hydrocarbons from a metal base of the metal vacuum chamber component to generate an as-machined surface of the metal vacuum chamber component. Subsequent to the machining, the generating includes performing a surface machining of the as-machined surface of the metal vacuum chamber component to remove a second portion of the hydrocarbons from the metal base to generate the finished surface of the metal vacuum chamber component. Subsequent to the surface machining, the generating includes surface treating the metal vacuum chamber component to remove a third portion of the hydrocarbons. Subsequent to the surface treating, the generating further includes performing a cleaning of the metal vacuum chamber component. Subsequent to the performing of the cleaning, the generating further includes drying the metal vacuum chamber component to generate the finished surface of the metal vacuum chamber component.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 2A-B illustrate cross-sectional views of a processing system, according to certain embodiments.

DETAILED DESCRIPTION OF EMBODIMENTS

Figure 1:
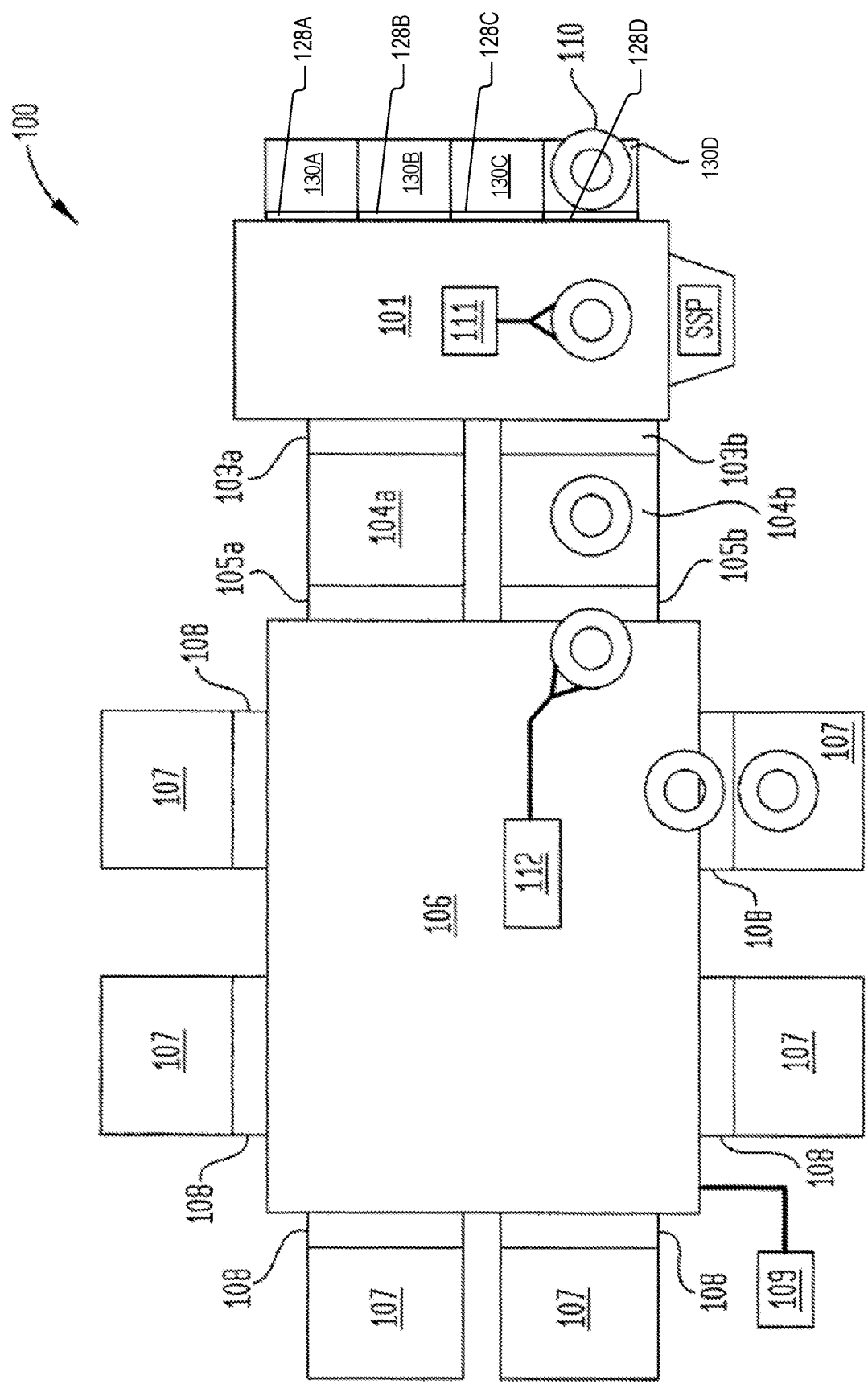
FIG. 1 illustrates a processing system, according to certain embodiments.

Embodiments described herein are related to surface machining (e.g., aluminum surface machining) of a metal component in a manufacturing system (e.g., to generate substantially organic contamination free finished surface of a metal component such as an aluminum component).

In a manufacturing system, such as a substrate manufacturing system, content (e.g., substrates, wafers, semiconductors, process kit rings, carriers, etc.) is transported between different portions of the manufacturing system (e.g., via robot arms). The environment of the substrate manufacturing system is controlled to provide a temperature, pressure, type of gas, and/or the like.

Conventionally, surfaces of components in the substrate manufacturing system have organic contamination (e.g., organic residue, hydrocarbons, etc.). Organic residue remains on the finished surfaces of components of the substrate processing system after conventional cleaning. For example, isopropyl alcohol (IPA) wipes do not remove the nanometer thick organics, etc. Once the components are disposed in the substrate processing system (e.g., vacuum system), part surface organics outgas (e.g., under high vacuum, such as 1E-8 Torr, and high temperature condition due to low vapor pressure at high temperature). The outgassed molecules are trapped and accumulate on surfaces (e.g., all vacuum surfaces, processing chamber walls, process kit ring, etc.). When an incoming substrate enters into the substrate processing system (e.g., vacuum chamber), the incoming substrate provides extra cold surface area, and gas molecule nucleation happens and condenses on cold substrate surfaces (e.g., with a distribution pattern on wafer edge, of a robot shape, or that is random). When a robot (e.g., providing an additional cold surface area) is exposed to surfaces (e.g., in a processing chamber) that are outgassing molecules, gas molecule nucleation occurs and condenses on the robot. Once the robot (e.g., robot blade, robot wrist) is heated and retracted, the robot comes in proximity of another component (e.g., a cold auxiliary robot blade, a cold substrate, etc.) and the outgassing molecules from the warm robot (e.g., blade, wrist) are condensed on the other component. Some of the contaminants are long molecules (e.g., long hydrocarbons) with high boiling temperatures and high sticking coefficient.

As contaminants (e.g., organic contamination, hydrocarbons, etc.) within the substrate processing system become disposed on the substrates (e.g., on-wafer organic contamination), the substrates become damaged and the yield of the substrate processing system (e.g., mass production factory) is reduced. On-wafer organic contamination impacts device performance after process integration (e.g., integrating the contaminated substrate in a device). In vacuum environments (e.g., ultra-low pressure; high vacuum product startup on products of physical layer deposition (PVD), chemical vapor deposition (CVD), or atomic layer deposition; etc.), outgassing from metal component surfaces (e.g., aluminum component surfaces) is a major root cause for on-wafer organic contamination.

Conventional metal (e.g., aluminum) component manufacturing methods contribute to organic contaminants. In some conventional systems, suspected components (e.g., that are suspected to be contributing more to contamination) are changed out (e.g., replaced), which is not time or cost efficient. In some conventional systems, wafer cycling plus residue gas analyzer (RGA) monitoring of the outgassing is used which is very time-consuming, expensive, and hard to predict.

The devices, systems, and methods disclosed herein provide surface machining (e.g., aluminum surface machining) in a substrate processing system (e.g., to generate substantially organic contamination free finished surface of an aluminum component). Embodiments are discussed with regards to metal surface machining and aluminum surface machining. It should be understood that an aluminum component as described herein, in some embodiments, is a pure aluminum component or a component composed of an aluminum alloy, such as: series 5000 aluminum alloy; series 6000 aluminum alloy; aluminum and one or more of copper, magnesium manganese, silicon, tin, zinc; and/or the like. Additionally, it should be understood that the surface machining techniques that are described herein with reference to aluminum, in some embodiments, also work for other types of metal surfaces, such as steel surfaces, surfaces where aluminum is not the predominant metal, stainless steel surfaces, titanium surfaces, stainless steel alloy surfaces, titanium alloy surfaces, and/or the like.

Prior to machining, a metal component (e.g., an aluminum component) includes a raw surface that includes a metal base (e.g., an aluminum base), a first native oxide (e.g., native oxide layer) disposed on the metal base, and hydrocarbons disposed on the metal base (e.g., hydrocarbon particles disposed within and/or on the native oxide layer). The raw surface of the metal component is machined to remove the first native oxide and a first portion of the hydrocarbons from the metal base to generate an as-machined surface of the metal component (e.g., including the metal base without the first native oxide and without the first portion of the hydrocarbons). A surface machining is performed on the as-machined surface of the metal component to remove a second portion of the hydrocarbons. In some embodiments, the surface machining is a non-abrasive surface machining (e.g., non-roughening surface machining, non-mechanically-abrasive surface machining, non-particulate-abrasive surface machining, non-jitterbug mechanical surface finishing). In some embodiments, the surface machining is an abrasive surface machining (e.g., roughening surface machining, mechanically-abrasive surface machining, particulate-abrasive surface machining, jitterbug mechanical surface finishing, etc.). The metal component is then surface treated (e.g., polished, etched using HF or $NHO_3$). Subsequent to the surface treating, the metal component is cleaned (e.g., via a cleaning agent, etc.) and the metal component is then dried (e.g., bake dried) to generate a finished surface of the metal component. In some embodiments, the finished surface of the metal component has an average surface roughness of up to 32 roughness average (Ra) micro-inch. In some embodiments, the metal component does not undergo a roughening (e.g., jitterbug, etc.) surface treatment.

The devices, systems, and methods disclosed herein have advantages over conventional solutions. The advantages include reducing organic contamination (e.g., hydrocarbons, organic residue, etc.) of the finished surfaces of the metal components disposed within a substrate processing system. This decreases cleaning time of the metal components, improves tool life cycle, improves tool readiness for production of substrates (e.g., decreases time between installation and production), decreases outgassing molecules from the metal components, decreases on-wafer organic contamination, increases yield of the substrate processing system, and reduces changing out of metal components. The present disclosure avoids the increased amount of replacement components, time consumption, and cost of conventional surface treatment systems and techniques that change out components suspected to be contributing to contaminants and that use wafer cycling plus RGA monitoring of outgassing. The advantages further include equipment tool final test and startup time being largely reduced and well- controlled compared to conventional systems and techniques. The advantages further include the cost of machining change being much less than the cycling wafers cost or replacing hardware cost of conventional systems and techniques. The present disclosure reduces (e.g., or eliminates) the contamination source and generates finished surfaces that are robust if customer test conditions (e.g., vacuum, temperature, etc.) changes. The present disclosure generates a smooth metal surface (e.g., via diamond blade machining and eliminating jitterbug polishing) to minimize embedded surface organic contaminants and does not outgas and contaminate the substrate (e.g., under ultra-low pressure process chamber environment, under high vacuum environment). The present disclosure removes the contamination source during metal component manufacturing (e.g., at supplier site) in embodiments. The present disclosure removes tooling marks.

Although some embodiments of the present disclosure refer to organic contamination free finished surface of a metal component (e.g., an aluminum component), in some embodiments, the finished surface of the metal component is substantially organic contamination free and/or has less organic contamination (e.g., hydrocarbons) than conventional systems.

As described herein, metal components and/or a metal base (e.g., aluminum components and/or an aluminum base) include, in some embodiments, other elements (e.g., aluminum components and the aluminum base are aluminum alloys). In some embodiments, the predominant metal in metal components and a metal base (e.g., aluminum components and aluminum base) is aluminum. In some embodiments, metal components and a metal base (e.g., aluminum components and aluminum base) include aluminum and one or more of copper, magnesium manganese, silicon, tin, zinc, and/or the like. In some embodiments, metal components and a metal base include stainless steel, stainless steel alloy, titanium, titanium alloy, and/or the like.

FIG. 1 illustrates a processing system 100 (e.g., wafer processing system, substrate processing system, semiconductor processing system) according to certain embodiments. The processing system 100 includes a factory interface 101 and load ports 128 (e.g., load ports 128A-D). In some embodiments, the load ports 128A-D are directly mounted to (e.g., seal against) the factory interface 101. Enclosure systems 130 (e.g., cassette, front opening unified pod (FOUP), process kit enclosure system, or the like) are configured to removably couple (e.g., dock) to the load ports 128A-D. Referring to FIG. 1, enclosure system 130A is coupled to load port 128A, enclosure system 130B is coupled to load port 128B, enclosure system 130C is coupled to load port 128C, and enclosure system 130D is coupled to load port 128D. In some embodiments, one or more enclosure systems 130 are coupled to the load ports 128 for transferring wafers and/or other substrates into and out of the processing system 100. Each of the enclosure systems 130 seal against a respective load port 128. In some embodiments, a first enclosure system 130A is docked to a load port 128A (e.g., for replacing used process kit rings). Once such operation or operations are performed, the first enclosure system 130A is then undocked from the load port 128A, and then a second enclosure system 130 (e.g., a FOUP containing wafers) is docked to the same load port 128A. In some embodiments, an enclosure system 130 (e.g., enclosure system 130A) is an enclosure system with shelves for aligning carriers and/or process kit rings.

In some embodiments, a load port 128 includes a front interface that forms a vertical opening (or a substantially vertical opening). The load port 128 additionally includes a horizontal surface for supporting an enclosure system 130 (e.g., cassette, process kit enclosure system). Each enclosure system 130 (e.g., FOUP of wafers, process kit enclosure system) has a front interface that forms a vertical opening. The front interface of the enclosure system 130 is sized to interface with (e.g., seal to) the front interface of the load port 128 (e.g., the vertical opening of the enclosure system 130 is approximately the same size as the vertical opening of the load port 128). The enclosure system 130 is placed on the horizontal surface of the load port 128 and the vertical opening of the enclosure system 130 aligns with the vertical opening of the load port 128. The front interface of the enclosure system 130 interconnects with (e.g., clamp to, be secured to, be sealed to) the front interface of the load port 128. A bottom plate (e.g., base plate) of the enclosure system 130 has features (e.g., load features, such as recesses or receptacles, that engage with load port kinematic pin features, a load port feature for pin clearance, and/or an enclosure system docking tray latch clamping feature) that engage with the horizontal surface of the load port 128. The same load ports 128 that are used for different types of enclosure systems 130 (e.g., process kit enclosure system, cassettes that contain wafers, etc.).

In some embodiments, the enclosure system 130 (e.g., process kit enclosure system) includes one or more items of content 110 (e.g., one or more of a process kit ring, an empty process kit ring carrier, a process kit ring disposed on a process kit ring carrier, a placement validation wafer, etc.). In some examples, the enclosure system 130 is coupled to the factory interface 101 (e.g., via load port 128) to enable automated transfer of a process kit ring on a process kit ring carrier into the processing system 100 for replacement of a used process kit ring.

In some embodiments, the processing system 100 also includes first vacuum ports 103a, 103b coupling the factory interface 101 to respective degassing chambers 104a, 104b. Second vacuum ports 105a, 105b are coupled to respective degassing chambers 104a, 104b and disposed between the degassing chambers 104a, 104b and a transfer chamber 106 to facilitate transfer of wafers and content 110 (e.g., process kit rings) into the transfer chamber 106. In some embodiments, a processing system 100 includes and/or uses one or more degassing chambers 104 and a corresponding number of vacuum ports 103, 105 (e.g., a processing system 100 includes a single degassing chamber 104, a single first vacuum port 103, and a single second vacuum port 105). The transfer chamber 106 includes a plurality of processing chambers 107 (e.g., four processing chambers 107, six processing chambers 107, etc.) disposed therearound and coupled thereto. The processing chambers 107 are coupled to the transfer chamber 106 through respective ports 108, such as slit valves or the like. In some embodiments, the factory interface 101 is at a higher pressure (e.g., atmospheric pressure) and the transfer chamber 106 is at a lower pressure (e.g., vacuum). Each degassing chamber 104 (e.g., loadlock, pressure chamber) has a first door (e.g., first vacuum port 103) to seal the degassing chamber 104 from the factory interface 101 and a second door (e.g., second vacuum port 105) to seal the degassing chamber 104 from the transfer chamber 106. Content is to be transferred from the factory interface 101 into a degassing chamber 104 while the first door is open and the second door is closed, the first door is to close, the pressure in the degassing chamber 104 is to be reduced to match the transfer chamber 106, the second door is to open, and the content is to be transferred out of the degassing chamber 104. A local center finding (LCF) device is to be used to align the content in the transfer chamber 106 (e.g., before entering a processing chamber 107, after leaving the processing chamber 107).

In some embodiments, the processing chambers 107 includes or more of etch chambers, deposition chambers (including atomic layer deposition, chemical vapor deposition, physical vapor deposition, or plasma enhanced versions thereof), anneal chambers, or the like.

Factory interface 101 includes a factory interface robot 111. Factory interface robot 111 includes a robot arm, such as a selective compliance assembly robot arm (SCARA) robot. Examples of a SCARA robot include a 2 link SCARA robot, a 3 link SCARA robot, a 4 link SCARA robot, and so on. The factory interface robot 111 includes an end effector on an end of the robot arm. The end effector is configured to pick up and handle specific objects, such as wafers. Alternatively, or additionally, the end effector is configured to handle objects such as a carrier and/or process kit rings (edge rings). The robot arm has one or more links or members (e.g., wrist member, upper arm member, forearm member, etc.) that are configured to be moved to move the end effector in different orientations and to different locations. The factory interface robot 111 is configured to transfer objects between enclosure systems 130 (e.g., cassettes, FOUPs) and degassing chambers 104a, 104b (or load ports).

Transfer chamber 106 includes a transfer chamber robot 112. Transfer chamber robot 112 includes a robot arm with an end effector at an end of the robot arm. The end effector is configured to handle particular objects, such as wafers. In some embodiments, the transfer chamber robot 112 is a SCARA robot, but has fewer links and/or fewer degrees of freedom than the factory interface robot 111 in some embodiments.

A controller 109 controls various aspects of the processing system 100. The controller 109 is and/or includes a computing device such as a personal computer, a server computer, a programmable logic controller (PLC), a microcontroller, and so on. The controller 109 includes one or more processing devices, which, in some embodiments, are general-purpose processing devices such as a microprocessor, central processing unit, or the like. More particularly, in some embodiments, the processing device is a complex instruction set computing (CISC) microprocessor, reduced instruction set computing (RISC) microprocessor, very long instruction word (VLIW) microprocessor, or a processor implementing other instruction sets or processors implementing a combination of instruction sets. In some embodiments, the processing device is one or more special-purpose processing devices such as an application specific integrated circuit (ASIC), a field programmable gate array (FPGA), a digital signal processor (DSP), network processor, or the like. In some embodiments, the controller 109 includes a data storage device (e.g., one or more disk drives and/or solid state drives), a main memory, a static memory, a network interface, and/or other components. In some embodiments, the controller 109 executes instructions to perform any one or more of the methods or processes described herein. The instructions are stored on a computer readable storage medium, which include one or more of the main memory, static memory, secondary storage and/or processing device (during execution of the instructions). The controller 109 receives signals from and sends controls to factory interface robot 111 and wafer transfer chamber robot 112 in some embodiments.

FIG. 1 schematically illustrates transfer of content 110 (e.g., a process kit ring coupled to a process kit ring carrier) into a processing chamber 107. According to one aspect of the disclosure, content 110 is removed from an enclosure system 130 via factory interface robot 111 located in the factory interface 101. The factory interface robot 111 transfers the content 110 through one of the first vacuum ports 103a, 103b and into a respective degassing chamber 104a, 104b. A transfer chamber robot 112 located in the transfer chamber 106 removes the content 110 from one of the degassing chambers 104a, 104b through a second vacuum port 105a or 105b. The transfer chamber robot 112 moves the content 110 into the transfer chamber 106, where the content 110 is transferred to a processing chamber 107 though a respective port 108. While not shown for clarity in FIG. 1, transfer of the content 110 includes transfer of a process kit ring disposed on a process kit ring carrier, transfer of an empty process kit ring carrier, transfer of a placement validation wafer, etc.

FIG. 1 illustrates one example of transfer of content 110, however, other examples are also contemplated. In some examples, it is contemplated that the enclosure system 130 is coupled to the transfer chamber 106 (e.g., via a load port mounted to the transfer chamber 106). From the transfer chamber 106, the content 110 is to be loaded into a processing chamber 107 by the transfer chamber robot 112. Additionally, in some embodiments, content 110 is loaded into a substrate support pedestal (SSP). In some embodiments, an additional SSP is positioned in communication with the factory interface 101 opposite the illustrated SSP. Processed content 110 (e.g., a used process kit ring) is to be removed from the processing system 100 in reverse of any manner described herein. When utilizing multiple enclosure systems 130 or a combination of enclosure system 130 and SSP, in some embodiments, one SSP or enclosure system 130 is to be used for unprocessed content 110 (e.g., new process kit rings), while another SSP or enclosure system 130 is to be used for receiving processed content 110 (e.g., used process kit rings).

The processing system 100 includes chambers, such as factory interface 101 (e.g., equipment front end module (EFEM)), transfer chamber 106, and adjacent chambers (e.g., load port 128, enclosure system 130, SSP, degassing chamber 104 such as a loadlock, processing chambers 107, or the like) that are adjacent to the factory interface 101 and/or the transfer chamber 106. One or more of the chambers is sealed (e.g., each of the chambers is sealed). The adjacent chambers are sealed to the factory interface 101 and/or the transfer chamber 106. In some embodiments, inert gas (e.g., one or more of nitrogen, argon, neon, helium, krypton, or xenon) is provided into one or more of the chambers (e.g., the factory interface 101, transfer chamber 106, and/or adjacent chambers) to provide one or more inert environments. In some examples, the factory interface 101 is an inert EFEM that maintains the inert environment (e.g., inert EFEM minienvironment) within the factory interface 101 so that users do not need to enter the factory interface 101 (e.g., the processing system 100 is configured for no manual access within the factory interface 101).

In some embodiments, gas flow (e.g., providing inert gas, providing nitrogen, exhausting gas to provide a vacuum environment, etc.) is provided into and/or from one or more chambers (e.g., factory interface 101, transfer chamber 106, adjacent chambers, etc.) of the processing system 100.

In some embodiments, the gas flow is greater than leakage through the one or more chambers to maintain a positive pressure within the one or more chambers. In some embodiments, the exhausted gas flow is greater than leakage through the one or more chambers to maintain a negative pressure within the one or more chambers.

In some embodiments, the inert gas within the factory interface 101 is recirculated. In some embodiments, a portion of the inert gas is exhausted. In some embodiments, the gas flow of non-recirculated gas into the one or more chambers is greater than the exhausted gas flow and the gas leakage to maintain a positive pressure of inert gas within the one or more chambers. In some embodiments, exhausted gas flow out of the one or more chambers is greater than gas leakage (e.g., and gas flow) into the one or more chambers to maintain a negative pressure (e.g., vacuum environment) within the one or more chambers.

In some embodiments, the one or more chambers are coupled to one or more valves and/or pumps to provide the gas flow into and/or out of the one or more chambers. A processing device (e.g., of controller 109) controls the gas flow into and out of the one or more chambers. In some embodiments, the processing device receives sensor data from one or more sensors (e.g., oxygen sensor, moisture sensor, motion sensor, door actuation sensor, temperature sensor, pressure sensor, etc.) and determines, based on the sensor data, the flow rate of inert gas flowing into and/or flow rate of gas flowing out of the one or more chambers.

One or more of the components (e.g., metal components, aluminum components) within the processing system 100 (e.g., portions of the processing system 100 that are under vacuum) are generated by performing method 300A or 300B to remove hydrocarbons to generate finished surfaces, in accordance with embodiments described herein. In some examples, the factory interface, load ports, load locks, cassettes, SSP, transfer chamber and/or processing chambers have been machined according to embodiments described herein. The finished surfaces have an average surface roughness of up to 32 Ra micro-inch. By removing the hydrocarbons from the surfaces of one or more of these components of the processing system 100, organic contamination within the processing system 100 is greatly reduced.

FIG. 2A illustrates a cross-sectional view of a processing system 200A (e.g., processing system 100 of FIG. 1), according to certain embodiments. FIG. 2B illustrates a cross-sectional view of a processing system 200B (e.g., processing system 100 of FIG. 1), according to certain embodiments. In some embodiments, processing systems 200A and 200B are the same processing system 200.

The processing system 200 includes a factory interface 201 (e.g., factory interface 101 of FIG. 1). The processing system 200 includes chambers that are coupled to the factory interface 201. For example, the factory interface 201 is coupled to one or more of enclosure system 202 (e.g., substrate enclosure system, enclosure system 102 of FIG. 1), load port 228 (e.g., load port 128 of FIG. 1), loadlock system 204 (e.g., degassing chamber 104a and/or 104b of FIG. 1), a transfer chamber 206 (e.g., transfer chamber 106 of FIG. 1), and/or processing chamber 107 (e.g., processing chamber 107 of FIG. 1). The factory interface 201 includes a robot arm 211 (e.g., factory interface robot 111 of FIG. 1) and transfer chamber 206 includes a robot arm 212 (e.g., transfer chamber robot 112 of FIG. 1). One or more portions of processing system 200 is placed in an open position or a closed position (e.g., sealed position). Gas flow is provided into and/or out of one or more portions of the processing system 200 (e.g., responsive to being in an open position, responsive to being in a closed position, responsive to transitioning between open and closed positions, based on sensor data, and/or via ports).

Enclosure system 202 is in a closed position responsive to a door 230 being coupled (e.g., sealed) to the enclosure system 202.

Load port 228 is configured to be placed in a closed position under certain circumstances. For example, a door carrier 232 is coupled (e.g., sealed) to a first portion of the load port 228 and the enclosure system 202 and/or door 230 is coupled (e.g., sealed) to a second portion of the load port 228. In some embodiments, the door carrier 232 is configured to place the door 230 in a closed position and in an open position (e.g., the door carrier 232 is configured to remove the door 230 from the enclosure system 202 and to secure the door 230 to the enclosure system 202).

Loadlock system 204 is in a closed position responsive to doors 203 and 205 being sealed to the loadlock system 204. In some embodiments, the loadlock system 204 has multiple loadlock chambers 236 and each loadlock chamber 236 has corresponding doors 203, 205.

The processing chamber 207 is in a closed position responsive to door 234 being coupled (e.g., sealed) to the processing chamber 207.

The factory interface 201 is in a closed position responsive to the door carrier 232 (or door 230) and the doors 203 being in closed positions. The transfer chamber 206 is in a closed position responsive to the doors 205 and the door 234 being in closed positions.

Responsive to door carrier 232 and/or door 230 being in an open position (e.g., see FIG. 2B), robot arm 211 transports content (e.g., a wafer) from the enclosure system 202 to a different portion of the processing system 200 (e.g., to factory interface 201, to loadlock system 204, to a storage area, cooling station, metrology station, etc.). Responsive to door 234 being in an open position (e.g., see FIG. 2B), robot arm 212 transports content (e.g., wafer) from the processing chamber 207 to another portion of the processing system 200 (e.g., to transfer chamber 206, to loadlock system 204, etc.).

One or more portions of the processing system 200 include one or more corresponding ports (e.g., inlet, outlet, etc.). One or more flow devices (e.g., recirculation pump, exhaust pump, insertion pump, valve, etc.) are coupled to the ports.

In some embodiments, a processing device (e.g., controller 109 of FIG. 1) causes gas flow (e.g., supplying non-recirculated gas, supplying recirculated gas, exhausting gas, etc.) through the ports. In some embodiments, the processing device receives sensor data (e.g., oxygen sensor, moisture sensor, door actuation sensor, temperature sensor, etc.) and causes gas flow through one or more ports based on the sensor data.

In some embodiments, a first environment (e.g., vacuum environment) is provided in the transfer chamber 206 and the processing chamber 207. In some embodiments, the first environment (e.g., vacuum environment) is provided in the loadlock system 204 prior to being opened (e.g., via doors 205) to the transfer chamber 206.

In some embodiments, a second environment (e.g., positive pressure environment, atmospheric environment, inert gas environment, vacuum environment, etc.) is provided in the factory interface 201, enclosure system 202, and load port 228. In some embodiments, the second environment is provided in in the loadlock system 204 prior to being opened (e.g., via doors 203) to the factory interface 201.

In some embodiments, all surfaces of metal components (e.g., aluminum components) that are part of the vacuum environment (e.g., transfer chamber 206, processing chamber 207, loadlock system 204, doors 205, doors 203, robot arm 212, etc.) are generated by performing method 300A or 300B to remove hydrocarbons to generate finished surfaces. The finished surfaces have an average surface roughness of up to 32 Ra micro-inch. By removing the hydrocarbons, organic contamination within the vacuum environment of the processing system 200 (e.g., and other portions of the processing system 200) is greatly reduced.

Figure 3A:
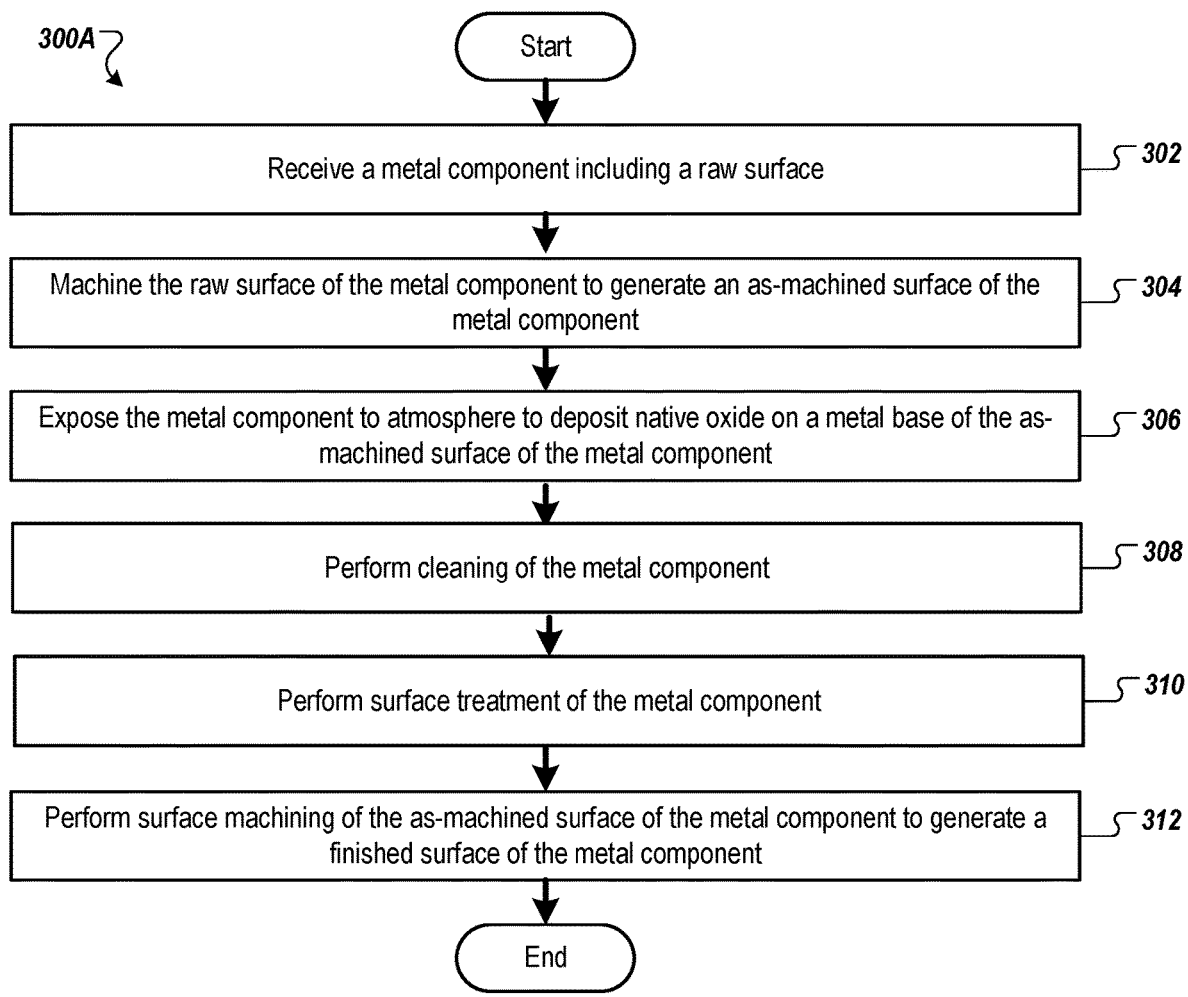
FIGS. 3A-B illustrate methods of generating finished surfaces of metal components of processing systems, according to certain embodiments.
Figure 3B:
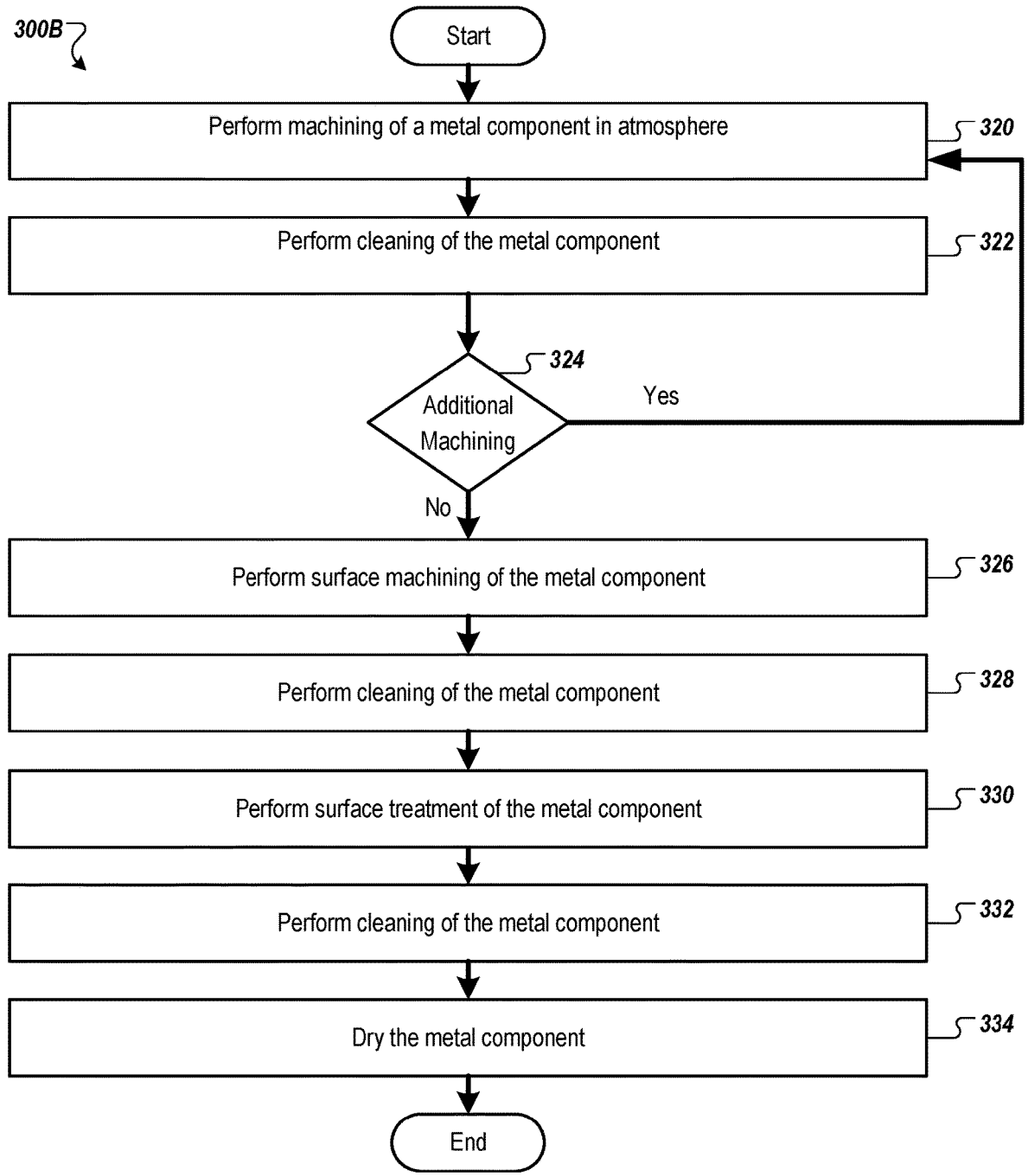

FIGS. 3A-B illustrates methods 300A-B of generating finished surfaces of metal components of processing systems, according to certain embodiments. One or more operations of one or more of methods 300A-B is performed by manufacturing equipment. In some embodiments, the same manufacturing equipment is used for multiple operations and/or different operations are performed by different manufacturing equipment. In some embodiments, the manufacturing equipment is controlled by processing logic that includes hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, one or more of methods 300A-B is controlled by a controller (e.g., controller 109 of FIG. 1, controller 409 of FIG. 4B). In some embodiments, one or more of methods 300A-B is controlled by a server device (e.g., in communication with controller 109 of FIG. 1). In some embodiments, a non-transitory storage medium stores instructions that when executed by a processing device (e.g., of controller 109 of FIG. 1, of controller 409 of FIG. 4B, of a server device, etc.) cause the processing device to perform one or more of methods 300A-B.

Although shown in a particular sequence or order, unless otherwise specified, the order of the operations can be modified (e.g., blocks 308-310 of method 300A can occur after block 312 of method 300A). One or more operations can be combined (e.g., blocks 304-306 of method 300A can be combined). One or more operations can be repeated (e.g., blocks 304-308 of method 300A can be repeated). Thus, the illustrated embodiments should be understood only as examples, and the illustrated operations can be performed in a different order, and some operations can be performed in parallel. Additionally, one or more operations (e.g., one or more of blocks 306-310 of method 300A) can be omitted in various embodiments. Thus, not all operations are used in every embodiment.

Referring to method 300A of FIG. 3A, at block 302, a metal component (e.g., an aluminum component, stainless steel component, titanium component, vacuum chamber component, aluminum alloy component, stainless steel alloy component, titanium alloy component, etc.) including a raw surface (e.g., see metal component 400A of FIG. 4A, equipment 450A of FIG. 4B) is received. The raw surface includes a metal base (e.g., an aluminum base, aluminum alloy base), a first native oxide (e.g., oxide layer) disposed on the metal base, and hydrocarbons disposed on the metal base (e.g., hydrocarbon particles disposed in and on the oxide layer).

In some embodiments, the metal component (e.g., the metal base, the aluminum base) is a raw monolith. In some embodiments, the metal component (e.g., metal base, aluminum base) is an aluminum alloy. In some examples, the metal component (e.g., the metal base, the aluminum base) includes one or more of Aluminum 6061-T6, Aluminum 6062-T6, any of Aluminum 6000 series (e.g., 6000 series aluminum alloy), Aluminum 5052, any of Aluminum 5000 series (e.g., 5000 series aluminum alloy), Alimex® ACP 5080RS, Alimex® 5080R (ACP 5080R), Alimex® 5080S (ACP 5080S), Alpase 5083 M-5™, PCP 5083 Max5®, and/or Vista Duramold-5™. Alternatively, in some embodiments, other metallic components that are not aluminum are received and processed. In some embodiments, the metal component is stainless steel, 300 series stainless steel and nitronic alloy, 400 series stainless steel, 17-4PH and 440C stainless steel, stainless steel alloy, titanium, and/or titanium alloy. The metal component may be configured to be exposed to (e.g., used in) an ultra-high vacuum (UHV) environment (e.g., transfer chamber, load lock, processing chamber).

In some embodiments, the metal component received in block 302 is a raw monolith (e.g., block of aluminum).

Figure 4A:
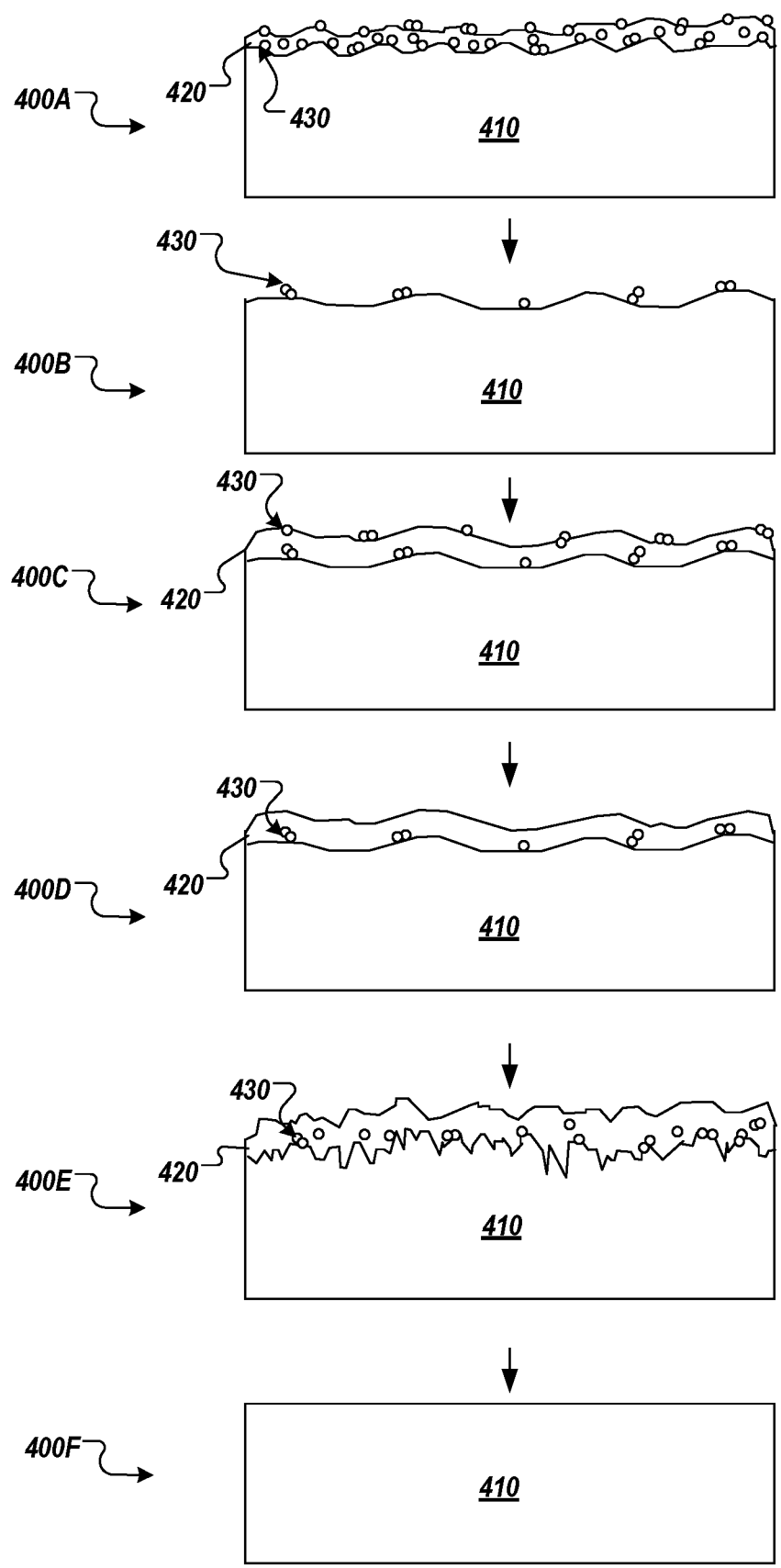
FIG. 4A illustrates cross-sectional views of a metal component of a processing system, according to certain embodiments.
Figure 4B:
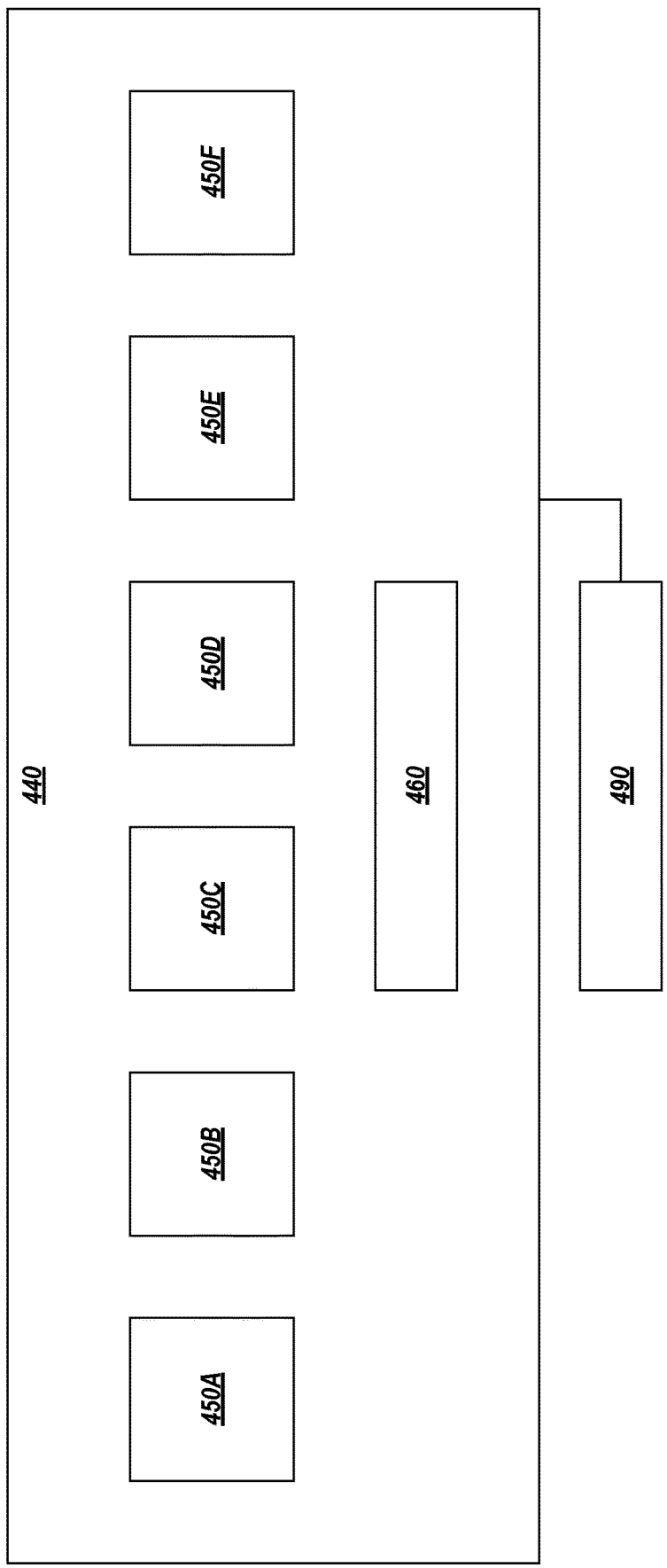
FIG. 4B illustrates a system for generating a finished surface of a metal component, according to certain embodiments.

At block 304, the raw surface of the metal component is machined to generate an as-machined surface (e.g., see metal component 400B of FIG. 4A, equipment 450B of FIG. 4B). In some embodiments, block 304 machines the metal component (e.g., raw monolith, block of aluminum) into the shaped metal component (e.g., part of a processing chamber, process kit ring, loadlock, door, transfer chamber, robot arm, LCF device, etc.) via one or more machining processes to generate the as-machined surface. In some embodiments, the machining of block 304 include a computer numeric controlled (CNC) apparatus, a mill, etc., which makes one or more cutting passes, each of which removes a portion of the raw surface to generate the as-machined surface. In some embodiments, block 304 is includes abrasive processes (e.g., jitterbug, bead blasting, sanding, etc.). The jitterbug surface treatment is a roughening surface treatment that uses an orbital sander to bring an abrasive pad in contact with a surface and moves the abrasive pad in random-orbit action to generate a jitterbugged (e.g., random-matte, wiggle pattern) surface finish. In a roughening surface treatment, abrasive particles polish the surface to remove machine marks and for cosmetic purposes. In some embodiments, block 304 is without abrasive processes (e.g., jitterbug, bead blasting, sanding, etc.). In some embodiments, block 304 machines the raw surface via abrasive surface machining. In some embodiments, block 304 machines the raw surface via non-abrasive surface machining. In some embodiments, different thicknesses of material are removed based on the type of metal component to be generated by method 300A.

In some embodiments, at block 304, the first native oxide (e.g., or at least a portion of the first native oxide) and a first portion of the hydrocarbons are removed from the metal base. The as-machined surface includes the metal base without the first native oxide and without the first portion of the hydrocarbons. In some embodiments, at block 304, a portion of the metal base is removed.

At block 306, the metal component is exposed to atmosphere to deposit second native oxide on a metal base of the as-machined surface of the metal component (e.g., see metal component 400C of FIG. 4A, equipment 450C of FIG. 4B). In some embodiments, hydrocarbons (e.g., from block 304) are disposed in and on the second native oxide on the metal base. In some embodiments, the machining of the metal component at block 304 is performed in atmosphere (e.g., blocks 304-306 occur at the same time or substantially the same time).

At block 308, cleaning (e.g., via a cleaning agent) of the metal component is performed (e.g., see metal component 400D of FIG. 4A, equipment 450D of FIG. 4B). In some embodiments, the cleaning removes a second portion of the hydrocarbons (e.g., does not completely remove the hydrocarbons). In some embodiments, block 308 includes first exposing the metal component to cleaner and then rinsing. In some embodiments, block 308 includes one or more rounds of cleaning and one or more rounds of rinsing. In some embodiments, one or more rounds of block 308 are before, during, and/or after one or more other blocks of method 300A. In some embodiments, blocks 304-308 are repeated to perform different machining operations on the metal component.

At block 310, the metal component is surface treated (e.g., see metal component 400A of FIG. 4A, equipment 450A of FIG. 4B). In some embodiments, the surface treatment includes one or more of etching, polishing, depositing material on the surface of the metal component, electroplating, etc. In some embodiments, at block 310, HF and/or HNO$_3$ is used to surface treat (e.g., etch) the metal component. In some embodiments, other acids are used to surface treat (e.g., etch) the surface. In some embodiments, the surface treatment (e.g., etching) removes a third portion of the hydrocarbons (e.g., does not completely remove the hydrocarbons),In some embodiments, block 310 includes one or more rounds of surface treatment (e.g., etching). In some embodiments, one or more rounds of block 310 are before, during, and/or after one or more other blocks of method 300A.

At block 312, a surface machining of the as-machined surface of the metal component is performed to generate a finished surface of the metal component (e.g., see metal component 400E of FIG. 4A, equipment 450E of FIG. 4B). In some embodiments, the surface machining is an abrasive surface machining (e.g., roughening surface machining, jitterbug mechanical surface finishing). In some embodiments, the surface machining is a non-abrasive surface machining (e.g., non-roughening surface machining, non-jitterbug mechanical surface finishing). In some embodiments, the non-abrasive surface machining (e.g., block 312) occurs prior to surface treatment (e.g., block 310). In some embodiments, another iteration of cleaning (e.g., block 308) occurs after surface machining (e.g., block 312), then surface treatment (e.g., block 310) occurs, and then another iteration of cleaning (e.g., block 308) occurs after the surface treatment (e.g., block 310).

In some embodiments, surface machining includes abrasive surface machining. In some embodiments, surface machining does not include abrasive surface machining. Abrasive surface machining includes mechanically abrasive surface machining, particulate abrasive surface machining, fixed (e.g., bonded) abrasive processes, grinding, honing, sanding, jitterbug surface finishing, polishing, abrasive blasting, bead blasting, and/or the like. In some embodiments, abrasive surface machining is referred to as a mechanically-abrasive surface machining, particulate-abrasive surface machining, roughening surface machining, jitterbug surface machining, and/or the like. In some embodiments, non-abrasive surface machining is referred to as a non-mechanically-abrasive surface machining, non-particulate-abrasive surface machining, non-roughening surface machining, non-jitterbug surface machining, and/or the like.

In some embodiments, the finished surface has one or more of an average surface roughness of up to 32 Ra micro-inch. In some embodiments, the finished surface has one or more of an average surface roughness of about 30-34 Ra micro-inch, about 22-32 Ra micro-inch, about 15-30 Ra micro-inch, about 16-32 Ra micro-inch, about 30-40 Ra micro-inch, and/or the like.

In some embodiments, at block 312, the second native oxide and a second portion of the hydrocarbons are removed (e.g., no hydrocarbons are disposed on the aluminum base of the aluminum component) to generate the finished surface. In some embodiments, at block 312, a portion of the metal base is removed. In some embodiments, the finished surface has one or more of an increased reflectivity and/or a decreased average surface roughness (e.g., compared to the as-machined surface, compared to conventional surfaces, compared to jitterbug surfaces, etc.).

In some embodiments, the surface machining (e.g., non-abrasive surface machining) of the as-machined surface eliminates a contamination source (e.g., hydrocarbons) from the finished surface of the metal component. In some embodiments, the metal component (e.g., finished surface of the metal component) is generated without mechanically abrasive surface treatments (e.g., roughening surface treatment, jitterbug surface treatment, random-matte surface treatment, orbital sander tool surface treatment, abrasive particle polishing surface treatment, polishing surface treatment, bead blasting surface treatment, and/or the like).

In some embodiments, the surface machining (e.g., non-abrasive surface machining) is performed using a machine that moves a rotating cutter head across a surface of the component being processed until some or all of the surface of the component has been cut. In some embodiments, the surface machining is performed, for example, using a computer numeric controlled (CNC) apparatus, a mill, etc., which makes one or more cutting passes, each of which removes a portion of the surface.

In some embodiments, the surface machining (e.g., non-abrasive) surface machining includes diamond cut machining. In some embodiments, diamond cut machining makes one or more cutting passes with a diamond cutting tool to cut away a portion of the metal component. In some embodiments the diamond cut machining is at a high speed with a small depth of cut. In some embodiments, the diamond cut machining is via a polycrystalline diamond (PCD) insert (e.g., cutter tip). In some embodiments, the diamond cut machining is via a tip (e.g., PCD insert) used in ball mill, end mill, fly mill, bore/drill, and/or lathe applications. In some embodiments, the surface machining (e.g., non-abrasive surface machining) is via a diamond blade applying one or more of a flat-cut, ball-mill, or end-mill machining of the as-machined surface of the metal component to generate the finished surface. In some embodiments, the diamond cut machining is via a single mount diamond blade. The surface machining (e.g., non-abrasive surface machining, diamond cut machining) may be high speed, thin cut, high feed rate, and may remove less than about half of a millimeter of thickness of the metal component.

In some embodiments, the surface machining (e.g., non-abrasive surface machining) includes carbide bi-mount machining (e.g., with a small insert diameter carbide insert). In some embodiments, carbide bi-mount machining is performed via a polycrystalline diamond (PCD) insert (e.g., cutter tip). In some embodiments, carbide bi-mount machining is performed via low to medium speed and small to large depth of cut (e.g., compared to the high speed and small depth of cut of diamond cut machining). In some embodiments, carbide-bi-mount machining is via a tip (e.g., PCD insert) used in ball mill, end mill, fly mill, bore/drill, and/or lathe applications.

In some embodiments, the surface machining (e.g., non-abrasive surface machining) includes machining of light finishing cuts at a low speed (e.g., not aggressive cuts). In some embodiments, the machining of light finishing cuts is at a low speed is at a low feed rate, light speed, and light depth (e.g., via carbide insert, via straight end mill, etc.). In some embodiments, the machining of light finishing cuts at a low speed is a final cut in the surface machining (e.g., non-abrasive surface machining) to obtain a particular finish and particular surface roughness. In some embodiments, the depth of the cut is very small with high feed rate (e.g., compared to other types of non-abrasive surface machining) to quickly remove chips from the as-machined surface. In some embodiments, the machining of light finishing cuts is by making one or more cutting passes with a cutting tool (e.g., cemented carbide, tungsten carbide, titanium carbide, PCD, diamond, carbide, cubic boron nitride, and/or the like) to cut away a portion of the metal component.

In some embodiments, the surface machining (e.g., non-abrasive surface machining) includes one or more of: diamond cut machining at a first speed (e.g., high speed); carbide bi-mount machining at a second speed (e.g., low to medium speed) that is lower than the first speed; and/or machining shallow finishing cuts at a third speed (e.g., low speed) that is lower than the first speed (e.g., and lower than the second speed).

In some embodiments, the surface machining (e.g., non-abrasive surface machining) speed (e.g., cutting speed) of the metal component is from 400 to 5000 surface feet per minute (SFM). In some embodiments, the surface machining (e.g., non-abrasive surface machining) speed (e.g., cutting speed) of the metal component is from 600 to 3000 SFM. In some embodiments, the surface machining (e.g., non-abrasive surface machining) speed (e.g., cutting speed) of the metal component is from 1000 to 5000 SFM.

In some embodiments, the diamond cut machining is performed at 1000 to 5000 SFM; carbide bi-mount machining at 600 to 3000 SFM; and machining shallow finishing cuts at 400 to 1000 SFM. In some embodiments, the diamond cut machining is at a speed that is greater than the speed of the carbide bi-mount machining and the carbide bi-mount machining is at a speed that is greater than the machining shallow finishing cuts.

In some embodiments, the finished surface is substantially flat and/or smooth. In some embodiments, the finished surface minimizes trapping of hydrocarbons and other contaminants. In some embodiments, the finished surface is proximate the native material (e.g., raw surface) without contaminants (e.g., hydrocarbons) and provides for defect and contamination control. In some embodiments the finished surface has a low Ra finish. In some embodiments, the final surface finish is achieved without performing any polishing (e.g., abrasive polishing) of the surface after the surface machining (e.g., non-abrasive surface machining) is performed.

In some embodiments, the finished surface of the metal component is one or more of: a first inside surface of a transfer chamber of a substrate processing system; a second inside surface of a processing chamber coupled to the transfer chamber; a third inside surface of a loadlock coupled to the transfer chamber; or an outer surface of a robot (e.g., outer surface of robot blade or robot wrist) disposed in the transfer chamber (e.g., and/or processing chamber).

FIG. 3B illustrates a method 300B of generating a finished surface of a metal component of a processing system, according to certain embodiments. In some embodiments, the metal component is aluminum, stainless steel, titanium, or an alloy thereof. In some embodiments, the metal component is a robot, sidewall of a chamber (e.g., transfer chamber, load lock chamber, processing chamber), and/or a metal component to be disposed within a vacuum environment (e.g., of a load lock, transfer chamber, and/or processing chamber).

Referring to method 300B of FIG. 3B, at block 320, machining of a metal component is performed in atmosphere. In some embodiments, block 320 is similar to blocks 304-306 of method 300A. The machining of the metal component may include one or more of a machine tool operation, a lathe operation, an end mill operation, using one or more types of cutters on a machine tool to obtain a shape of the metal component, performing machining operations to generate features (e.g., holes, blind holes, creases, non-welded seams, etc.), and/or the like. The machining (and number of iterations of machining) may depend on the intricacy and/or complexity of the metal component, the size of the metal component, the thickness of the material being removed (e.g., larger chunks or smaller pieces), and/or the like. The machining may be a rough cut or a semi-rough cut. In some embodiments, the machining removes material without creating chatter of the machining tool. Machining of a smaller metal component or a metal component with more features may remove less material and/or use less pressure (e.g., to not deform the shape of the metal component, to not impact the part definition) than a larger metal component or a metal component with less features.

At block 322, cleaning of the metal component is performed. In some embodiments, the cleaning is performed with a cleaning agent, such as alcohol, acetone, hydrochloric acid, a surface cleaner, etc. In some embodiments, the performing of the cleaning includes immersing the metal component in a cleaning agent (e.g., that includes $HNO_3$). In some embodiments, block 322 is similar to block 308 of method 300A.

At block 324, it is determined whether additional machining is to be performed. If additional machining is to be performed, flow returns to block 320. If additional machining is not be performed, flow continues to block 326.

In some embodiments, method 300B includes multiple iterations of machining (e.g., about 2 to 4 passes with a machining tool, each pass removes a portion of the metal component). In some examples, a first iteration of machining (e.g., first iteration of block 320) is rough machining, a second iteration of machining (e.g., second iteration of block 320) is semi-rough machining, a third iteration of machining (e.g., third iteration of block 320) is an architectural pass, and a fourth iteration of machining (e.g., fourth iteration of block 320 or block 326) is a finishing pass. The different iterations of machining may be performed by the same machine or different machines. In some embodiments, a cleaning operation occurs between each of the machining operations. In some embodiments, a cleaning operation does not occur between two or more machining operations.

In some embodiments, the surface of the metal component is maintained wet between iterations of machining (e.g., between iterations of block 320, between block 320 and block 326, etc.). In some embodiments, maintaining the metal component wet prevents the machining fluids and residues from drying on the metal component.

At block 326, a surface machining of the metal component is performed. In some embodiments, the surface machining is a roughening (e.g., jitterbug, bead blasting, etc.) surface machining. In some embodiments, the surface machining is a non-roughening (non-jitterbug) surface machining. Block 326 may be similar to block 312 of method 300A. The surface machining (e.g., roughening surface machining, non-roughening surface machining) may be a final cut, finishing cut, and/or a skim cut to generate a finished surface (e.g., a smooth surface) (e.g., removing less material than block 320). The surface machining (e.g., non-roughening surface machining) of block 326 may take a longer amount of time (e.g., additional thinner passes to obtain finer surface roughness) than the machining of block 320. In some embodiments, the surface machining (e.g., non-roughening surface machining) is a diamond cut (e.g., very low roughness). In some embodiments, method 300B is without contaminating process operations (e.g., without jitterbug operations, without bead-blast operations, without heat blast operations, etc.).

At block 328, a cleaning of the metal component is performed. In some embodiments, block 328 is similar to block 308 of method 300A and/or block 322 of method 300B.

At block 330, a surface treatment of the metal component is performed. In some embodiments, the surface treatment includes one or more of immersing the metal component in an acid etching solution (e.g., HF and/or $HNO_3$), polishing the metal component, depositing material on the surface of the metal component, electroplating the surface of the metal component, and/or the like. In some embodiments, block 330 is similar to block 310 of method 300A. The surface treatment may remove an upper layer of the metal component (e.g., a deep cleaning). In some embodiments, the surface treatment removes oxides (e.g., aluminum oxide), residuals from cleaning, impurities from previous operations (e.g., a previous bath), organics, and/or the like.

At block 332, a cleaning of the metal component is performed. In some embodiments, responsive to the surface treatment of block 330, residue is on the metal component and the cleaning of block 332 removes the residue. In some embodiments, block 332 is similar to block 308 of method 300A and/or block 322 of method 300B.

At block 334, drying (e.g., blow drying, bake drying) of the metal component is performed (e.g., to generate a finished surface). In some embodiments, the drying includes blow drying the metal component (e.g., with an inert gas) and/or bake drying (e.g., drying at a temperature above ambient) the metal component at about 80 to about 200 degrees Celsius (e.g., in an inert gas, in vacuum, etc.).

FIG. 4A illustrates cross-sectional views of a metal component 400A-F (e.g., an aluminum component) of a processing system (e.g., processing system 100 of FIG. 1, processing system 200 of FIGS. 2A-B), according to certain embodiments. In some embodiments, different operations of method 300 occur and/or different equipment of FIG. 4B are used between the different metal components 400A-F.

Metal component 400A has a raw surface that includes a metal base 410, a native oxide 420 (e.g., native oxide layer) disposed on the metal base 410, and hydrocarbons 430 (e.g., hydrocarbon particles) disposed on the metal base 410 (e.g., disposed within and on the native oxide layer). In some embodiments, the metal component 400A is contaminated with hydrocarbons 430 due to multiple incoming sources (e.g., packaging, handling, transportation, etc.). In some embodiments, the native oxide 420 is on the metal base 410 responsive to exposure of the metal component 400A to atmosphere. In some embodiments, metal component 400A is responsive to block 302 of method 300A of FIG. 3A. In some embodiments, metal component 400A is a raw monolith of metal (e.g., aluminum block).

Metal component 400B has an as-machined surface (e.g., responsive to a fresh milling of the surface) that includes the metal base 410 and a portion of the hydrocarbons 430 that were on the metal base 410 of metal component 400A. In some embodiments, metal component 400B is responsive to block 304 of method 300A of FIG. 3A. In embodiments, the as-machined surface is achieved by machining the raw surface of the metal component 400A to remove the first native oxide and a first portion of the hydrocarbons from the metal base 410. In some embodiments, the native oxide 420 has been removed so that the metal component 400B does not include native oxide 420. In some embodiments, a portion of the native oxide 420 has been removed so that the metal component 400B includes a portion of the native oxide 420 of metal component 400A.

Metal component 400C has an as-machined surface that has been exposed to atmosphere. In some embodiments, metal component 400C is responsive to block 306 of method 300A of FIG. 3A. Responsive to being exposed to atmosphere, the metal component 400C has a native oxide 420. The hydrocarbons 430 of metal component 400B are disposed on the metal base 410 of metal component 400C within and on the native oxide 420.

Metal component 400D has an as-machined surface that has been exposed to atmosphere and cleaned (e.g., via a cleaning agent). In some embodiments, metal component 400D is responsive to block 308 of method 300A of FIG. 3A. Responsive to being cleaned, a portion of the hydrocarbons 430 (e.g., hydrocarbons disposed on the native oxide 420) have been removed and a portion of the hydrocarbons 430 (e.g., disposed within the native oxide 420) remain on the metal base 410.

Metal component 400E has an as-machined surface that has been exposed to atmosphere, cleaned, and surface treated (e.g., etched with hydrogen fluoride (HF) or nitric acid ($HNO_3$), polished, deposited, electroplated, etc.). In some embodiments, metal component 400E is responsive to block 310 of method 300A of FIG. 3A. Responsive to being surface treated, at least a portion of the hydrocarbons 430 remain on the metal base 410 (e.g., within the native oxide 420).

Metal component 400F has a finished surface. In some embodiments, metal component 400F is responsive to block 312 of method 300A of FIG. 3A. The finished surface does not include hydrocarbons 430 (e.g., and does not include native oxide 420). The finished surface is generated by performing a surface machining (e.g., non-abrasive surface machining, such as non-jitterbug, non-roughening) of the as-machined surface of the metal component 400 to remove hydrocarbons 430. The finished surfaces has an average surface roughness of up to 32 Ra micro-inch. By removing the hydrocarbons, organic contamination within a substrate processing system (e.g., vacuum portion of a substrate processing system, processing system 100 of FIG. 1, processing system 200 of FIGS. 2A-B, etc.) is greatly reduced.

In some embodiments, corresponding operations of one or more of the metal components 400A-E is skipped or reordered to generate the finished surface of metal component 400F. In some embodiments, one or more of the operations (e.g., cleaning, surface treating) of metal components 400D-E are skipped or reordered. In some examples, metal component 400F has not been cleaned or surface treated. In some examples, the cleaning and/or surface treating occur after the finished surface of the metal component 400F has been generated by performing the surface machining (e.g., the cleaning and/or surface treating do not occur before the surface machining).

FIG. 4B illustrates a system 440 for generating a finished surface of a metal component 400 (e.g., an aluminum component), according to certain embodiments.

The system 440 includes equipment 450A-F and a controller 490. In some embodiments, the system 440 includes a transfer device 460 (e.g., robot arm, conveyor, etc.) to move the metal component between the sets of equipment 450A-F. In some embodiments, one or more of the sets of equipment 450A-F move to process the metal component. In some embodiments, two or more of the sets of equipment 450A-F are combined. Controller 490 controls the equipment 450A-F and the transfer device 460. In some embodiments, controller 490 has the same or similar functionalities as controller 190 of FIG. 1.

In some embodiments, one or more of the sets of equipment 450A-F are disposed in a clean organic-free environment to prevent airborne contamination. In some embodiments, intermittent cleaning occurs during part machining (e.g., before, during, and/or after use of equipment 450B and/or 400F) to minimize cross-contamination accumulation. In some embodiments, low outgassing materials (e.g., lubricant, O-ring, etc.) are used (e.g., for high vacuum applications). In some embodiments, organic stains-free material (e.g., cleanroom microfiber wipes, wipes constructed from a continuous filament micro denier, polyester/nylon textile wipes, and/or wipes that enhances absorbency and particle contamination removal, etc.) are used.

Equipment 450A receives the metal component 400A that has a raw surface that includes a metal base 410, a native oxide 420 disposed on the metal base 410, and hydrocarbons 430 disposed on the metal base 410. See block 302 of FIG. 3A.

Equipment 450B machines the raw surface to remove the native oxide 420 and a first portion of the hydrocarbons 430 from the metal base 410 to generate an as-machined surface of metal component 400B. See block 304 of FIG. 3A.

In some embodiments, equipment 450C exposes the metal component 400B to atmosphere to deposit (e.g., form) a native oxide 420 on the metal base 410 of the metal component 400B. See block 306 of FIG. 3A. In some embodiments, the metal component 400B is exposed to atmosphere without use of equipment 450C.

Equipment 450D cleans (e.g., via a cleaning agent) the metal component 400C to remove a second portion of the hydrocarbons 430 from the metal base 410. See block 308 of FIG. 3A.

Equipment 450E performs a surface treatment (e.g., etches, polishes, etc.) the metal component 400D to remove a third portion of the hydrocarbons 430 from the metal base 410. See block 310 of FIG. 3A.

Equipment 450F performs a surface machining (e.g., non-abrasive surface machining, such as non-jitterbug, non-roughening) of the as-machined surface of the metal component 400 to remove hydrocarbons 430 to generate a finished surface. See block 312 of FIG. 3A. In some embodiments, equipment 450F includes a diamond insert, diamond blade, diamond tip, diamond single mount, carbide bi-mount, carbide insert, carbide blade, carbide tip, or the like.

In some embodiments, on-wafer stains of substrates proximate to metal components (e.g., aluminum components, metal components of a processing system) at different temperatures are higher for conventional metal components (e.g., that have undergone roughening surface machining) compared to metal components formed according to the present disclosure.

In some embodiments, on-wafer stain counts of substrates proximate a conventional metal component (e.g., an aluminum component) are much higher than for a metal component formed according to the present disclosure. In some embodiments, a point of overload (e.g., substrate meets a threshold amount of on-wafer stain counts, substrate is not useable, substrate is to be discarded, and/or the like) of on-wafer stain counts is reached at elevated temperatures (e.g., in excess of about 100 to about 150 degrees Celsius) for conventional metal components.

In some embodiments, on-wafer stain counts of substrates proximate a metal component (e.g., an aluminum component) formed according to the present disclosure (e.g., method 300A of FIG. 3A, method 300B of FIG. 3B, metal component 400F) are much lower than conventional metal components.

For conventional metal components, stains are triggered at a lower temperature (e.g., at about 20 to about 40 degrees Celsius) and ramp up with temperature increases under vacuum. In some embodiments, for metal components formed according to the present disclosure, small stains signal are triggered at a higher temperature (e.g., about 100 to about 150 degrees Celsius) under vacuum.

Examples described herein also relate to an apparatus for performing the methods described herein. In some embodiments, this apparatus is specially constructed for performing the methods described herein, or includes a general purpose computer system selectively programmed by a computer program stored in the computer system. In some embodiments, the computer program is stored in a computer-readable tangible storage medium.

The methods and illustrative examples described herein are not inherently related to any particular computer or other apparatus. In some embodiments, the various general purpose systems are used in accordance with the teachings described herein, or a more specialized apparatus is constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure are practiced without these specific details. In other instances, well-known components or methods are not described in detail or are presented in simple block diagram format in order to avoid unnecessarily obscuring the present disclosure. Thus, the specific details set forth are merely exemplary. Particular implementations vary from these exemplary details and are still contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

The terms "over," "under," "between," "disposed on," and "on" as used herein refer to a relative position of one material layer or component with respect to other layers or components. In some examples, one layer disposed on, over, or under another layer is directly in contact with the other layer or has one or more intervening layers. In some examples, one layer disposed between two layers is directly in contact with the two layers or has one or more intervening layers. Similarly, in some examples, one feature disposed between two features is in direct contact with the adjacent features or has one or more intervening layers.

Although the operations of the methods herein are shown and described in a particular order, in some embodiments, the order of operations of each method is altered so that certain operations are performed in an inverse order so that certain operations are performed, at least in part, concurrently with other operations. In another embodiment, instructions or sub-operations of distinct operations are in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   receiving a metal component comprising a raw surface that comprises a metal base, a first native oxide disposed on the metal base, and hydrocarbons disposed on the metal base;
   machining the raw surface of the metal component to remove the first native oxide and a first portion of the hydrocarbons from the metal base, wherein the machining generates an as-machined surface of the metal component comprising the metal base without the first native oxide and without the first portion of the hydrocarbons, wherein a second native oxide is deposited on the metal base of the as-machined surface of the metal component;

subsequent to the machining, performing a surface machining of the as-machined surface of the metal component to remove a second portion of the hydrocarbons and the second native oxide;

subsequent to the surface machining, surface treating the metal component to remove a third portion of the hydrocarbons;

subsequent to the surface treating, performing a cleaning of the metal component; and subsequent to the performing of the cleaning, drying the metal component to generate a finished surface of the metal component.

2. The method of claim 1, further comprising:

subsequent to the machining and prior to the performing of the surface machining, performing a corresponding cleaning of the metal component; and subsequent to the surface machining and prior to the surface treating, performing a respective cleaning of the metal component, wherein the metal component is maintained wet between the machining and the surface machining.

3. The method of claim 1, wherein the machining of the raw surface comprises:

performing a first machining operation;

subsequent to the first machining operation, performing a first respective cleaning;

subsequent to the first respective cleaning, performing a second machining operation, wherein the metal component is maintained wet between the first machining operation and the second machining operation; and subsequent to the second machining operation, performing a second respective cleaning.

4. The method of claim 1, wherein the performing of the cleaning comprises soaking the metal component in a cleaning agent.

5. The method of claim 1, wherein the drying comprises performing a bake drying.

6. The method of claim 1, wherein the surface treating of the metal component is using at least one of hydrogen fluoride (HF) or nitric acid ($HNO_3$).

7. The method of claim 1, wherein the second native oxide is deposited on the metal base of the as-machined surface of the metal component responsive to the metal component being exposed to atmosphere.

8. The method of claim 1, wherein the finished surface of the metal component is generated without mechanically abrasive surface treatments, and wherein the finished surface of the metal component has an average surface roughness of up to 32 roughness average (Ra) micro-inch.

9. The method of claim 1, wherein the finished surface is configured to be exposed to a vacuum environment in a substrate processing system.

10. The method of claim 1, wherein the surface machining comprises one or more of:

diamond cut machining at a first speed;

carbide bi-mount machining at a second speed that is lower than the first speed; or machining of a plurality of shallow finishing cuts at a third speed that is lower than the first speed.

11. The method of claim 1, wherein the finished surface of the metal component is one or more of:

a first inside surface of a transfer chamber of a substrate processing system;

a second inside surface of a processing chamber coupled to the transfer chamber;

a third inside surface of a loadlock coupled to the transfer chamber; or an outer surface of a robot disposed in the transfer chamber.

12. The method of claim 1, wherein the finished surface is configured to be disposed in a substrate processing system, and wherein the method decreases embedded surface organic contaminants to prevent outgassing and cross-contaminating of content transferred by the substrate processing system.

13. A method comprising:

generating a finished surface of a metal vacuum chamber component of a substrate processing system, the generating comprising:

machining a raw surface of the metal vacuum chamber component to remove a first native oxide and a first portion of hydrocarbons from a metal base of the metal vacuum chamber component to generate an as-machined surface of the metal vacuum chamber component, wherein second native oxide is deposited on the metal base of the as-machined surface of the metal vacuum chamber component;

subsequent to the machining, performing a surface machining of the as-machined surface of the metal vacuum chamber component to remove a second portion of the hydrocarbons and the second native oxide from the metal base;

subsequent to the surface machining, surface treating the metal vacuum chamber component to remove a third portion of the hydrocarbons;

subsequent to the surface treating, performing a cleaning of the metal vacuum chamber component; and subsequent to the performing of the cleaning, drying the metal vacuum chamber component to generate the finished surface of the metal vacuum chamber component.

14. The method of claim 13, further comprising:

subsequent to the machining and prior to the performing of the surface machining, performing a corresponding cleaning of the metal vacuum chamber component; and subsequent to the surface machining and prior to the surface treating, performing a respective cleaning of the metal vacuum chamber component.

15. The method of claim 13, wherein the machining of the raw surface comprises:

performing a first machining operation;

subsequent to the first machining operation, performing a first respective cleaning;

subsequent to the first respective cleaning, performing a second machining operation; and subsequent to the second machining operation, performing a second respective cleaning.

16. The method of claim 13, wherein the performing of the cleaning comprises soaking the metal vacuum chamber component in a cleaning agent.

17. The method of claim 13, wherein the drying comprises bake drying the metal vacuum chamber component.

18. The method of claim 13, wherein the second native oxide is deposited on the metal base of the as-machined surface of the metal vacuum chamber component responsive to the metal vacuum chamber component being exposed to atmosphere.

19. The method of claim 13, wherein the surface machining comprises one or more of:
    diamond cut machining at a first speed;
    carbide bi-mount machining at a second speed that is lower than the first speed; or
    machining of a plurality of shallow finishing cuts at a third speed that is lower than the first speed.

20. The method of claim 13, wherein the finished surface of the metal vacuum chamber component is generated without mechanically abrasive surface treatments, and wherein the finished surface of the metal vacuum chamber component has an average surface roughness of up to 32 roughness average (Ra) micro-inch.

* * * * *